US009029267B2

(12) United States Patent
Sant et al.

(10) Patent No.: US 9,029,267 B2
(45) Date of Patent: May 12, 2015

(54) CONTROLLING TEMPERATURE OF A FARADAY SHIELD

(71) Applicant: Lam Research Corporation, Fremont, CA (US)

(72) Inventors: Sanket Sant, Fremont, CA (US); Raphael Casaes, Alameda, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/896,175

(22) Filed: May 16, 2013

(65) Prior Publication Data

US 2014/0342568 A1    Nov. 20, 2014

(51) Int. Cl.
*H01L 21/302*    (2006.01)
*G05D 23/19*     (2006.01)
*H01L 21/3065*   (2006.01)

(52) U.S. Cl.
CPC ........ *G05D 23/1951* (2013.01); *H01L 21/3065* (2013.01)

(58) Field of Classification Search
USPC ............. 438/5, 706, 710, 715, 716, 731, 732, 438/714; 134/1.1, 1.2; 216/67, 68
See application file for complete search history.

(56) References Cited

U.S. PATENT DOCUMENTS

| 4,633,812 | A | 1/1987 | Fujiyama |
| 4,918,031 | A | 4/1990 | Flamm et al. |
| 5,525,159 | A | 6/1996 | Hama et al. |
| 5,540,800 | A | 7/1996 | Qian |
| 5,622,635 | A | 4/1997 | Cuomo et al. |
| 6,250,563 | B1 | 6/2001 | Frank et al. |
| 6,280,563 | B1 | 8/2001 | Baldwin, Jr. et al. |
| 6,367,412 | B1 | 4/2002 | Ramaswamy et al. |
| 6,422,173 | B1 | 7/2002 | Nakajima |
| 6,474,258 | B2 | 11/2002 | Brcka .......... 118/723 I |
| 6,503,364 | B1 | 1/2003 | Masuda et al. |
| 6,523,493 | B1 | 2/2003 | Brcka .......... 118/723 I |
| 6,531,030 | B1 | 3/2003 | Nakajima |
| 6,666,982 | B2 | 12/2003 | Brcka |
| 7,223,321 | B1 | 5/2007 | Comendant et al. |
| 7,413,673 | B2 | 8/2008 | Lohokare et al. |
| 2001/0022158 | A1 | 9/2001 | Brcka .......... 118/723 I |
| 2003/0075349 | A1 | 4/2003 | Kruse et al. |
| 2004/0163595 | A1 | 8/2004 | Edamura et al. ........... 118/723 I |
| 2004/0194890 | A1 | 10/2004 | Moroz |

(Continued)

FOREIGN PATENT DOCUMENTS

| EP | 0 801 413 A1 | 10/1997 | |
| TW | 340295 | 9/1998 | ............... H05H 1/00 |
| TW | 200635446 A | 10/2006 | ............... H05H 1/24 |

OTHER PUBLICATIONS

U.S. Appl. No. 10/345,582, filed Jan. 15, 2003, Comendant et al.
U.S. Appl. No. 13/198,683, filed Aug. 4, 2011, Drewery et al.
U.S. Appl. No. 13/896,175, filed May 16, 2013, Sant et al.
U.S. Appl. No. 13/974,324, filed Aug. 23, 2013, Sriraman et al.

(Continued)

*Primary Examiner* — Lan Vinh
(74) *Attorney, Agent, or Firm* — Martine Penilla Group, LLP

(57) ABSTRACT

A method for controlling thermal cycling of a faraday shield in a plasma process chamber is provided. The method includes: performing a first plasma processing operation on a first wafer in the plasma process chamber; terminating the first plasma processing operation; performing a first wafer transfer operation to transfer the first wafer out of the chamber; and, during the first wafer transfer operation, applying power to a TCP coil under a plasma limiting condition.

20 Claims, 15 Drawing Sheets

(56) References Cited

U.S. PATENT DOCUMENTS

| | | | |
|---|---|---|---|
| 2005/0103444 A1 | 5/2005 | Brcka | |
| 2005/0103445 A1 | 5/2005 | Brcka | |
| 2006/0130758 A1 | 6/2006 | Lohokare et al. | 118/715 |
| 2006/0169669 A1* | 8/2006 | Zojaji et al. | 216/58 |
| 2007/0113981 A1* | 5/2007 | Brcka | 156/345.48 |
| 2007/0181257 A1* | 8/2007 | Comendant et al. | 156/345.48 |
| 2007/0238199 A1* | 10/2007 | Yamashita | 438/5 |
| 2008/0135518 A1 | 6/2008 | Chen et al. | 216/67 |
| 2011/0204023 A1 | 8/2011 | Huh et al. | 216/37 |
| 2011/0297320 A1 | 12/2011 | Sakka et al. | 156/345.48 |

OTHER PUBLICATIONS

PCT International Search Report and Written Opinion of the International Searching Authority (ISA) issued in International Application No. PCT/US2012/034837, ISA/US Commissioner for Patents, Apr. 24, 2012.

Mahoney et al., Electron-density and energy distributions in a planar inductively, May 3, 1994 Jul. 14, 2014.

Taiwan Search Report, 102138117, p. 5 from Examination Opinions, Nov. 10, 2014.

Singapore Search Report, 201307543-7, pp. 1-8, May 13, 2014.

\* cited by examiner

CONTROLLING TEMPERATURE OF A FARADAY SHIELD

FIELD OF THE INVENTION

The present invention relates generally to semiconductor fabrication, and more particularly, to a method for controlling the temperature of a faraday shield.

DESCRIPTION OF THE RELATED ART

In semiconductor manufacturing, etching processes are commonly and repeatedly carried out. As is well known to those skilled in the art, there are two types of etching processes: wet etching and dry etching. One type of dry etching is plasma etching performed using an inductively coupled plasma etching apparatus.

A plasma contains various types of radicals, as well as positive and negative ions. The chemical reactions of the various radicals, positive ions, and negative ions are used to etch features, surfaces and materials of a wafer. During the etching process, a chamber coil performs a function analogous to that of a primary coil in a transformer, while the plasma performs a function analogous to that of a secondary coil in the transformer.

Next generation magneto-resistive random access memory (MRAM) is a non-volatile memory technology promising fast write speeds, low power consumption, high density (small cell sizes), and long-term durability. Unlike other memory technologies such as DRAM, SRAM, and flash memory, MRAM is not based on stored charge but on stable magnetization states of a magnetic tunnel junction.

During the manufacture of magneto-resistive random access memory (MRAM), non-volatile etch products, including metals such as ruthenium (Ru), molybdenum (Mo), titanium (Ti), etc. may adhere to interior surfaces of the plasma process chamber, including those of the chamber walls and an internal faraday shield. The resulting film/residue of non-volatile etch products are not removed by autocleaning processes. Instead, they are allowed to build up over repeated process operations, and are periodically removed by a chamber reconditioning procedure.

However, the presence of such deposits inside the chamber and particularly on the faraday shield can be problematic. Particles may flake off and deposit on the electrostatic chuck, possibly interfering with chucking of wafers, or may deposit on a wafer present in the chamber, potentially destroying circuitry and adversely impacting yield.

It is in this context that embodiments of the invention arise.

SUMMARY

Disclosed is a method for controlling the temperature of a faraday shield to reduce thermal cycling and thereby reduce particulate generation in a plasma processing chamber. It should be appreciated that the present invention can be implemented in numerous ways, such as a process, an apparatus, a system, a device or a method embodied on a computer-readable medium. Several inventive embodiments of the present invention are described below.

In one embodiment, a method for controlling thermal cycling of a faraday shield in a plasma process chamber is provided. The method includes: performing a first plasma processing operation on a first wafer in the plasma process chamber; terminating the first plasma processing operation; performing a first wafer transfer operation to transfer the first wafer out of the chamber; and, during the first wafer transfer operation, applying power to a TCP coil under a plasma limiting condition.

In one embodiment, applying power to the TCP coil during the first wafer transfer operation prevents a drop in temperature greater than about 10 degrees Centigrade of a faraday shield of the plasma process chamber, the drop in temperature defined from a peak temperature of the faraday shield achieved during the first plasma processing operation.

In one embodiment, the method further includes: performing a second wafer transfer operation to transfer a second wafer into the plasma process chamber; during the second wafer transfer operation, applying power to the TCP coil under a plasma limiting condition; and performing a second plasma processing operation on the second wafer in the plasma process chamber.

In one embodiment, the method further includes: after the first wafer transfer operation, performing a wafer-less autocleaning operation.

In one embodiment, applying power to the TCP coil during the first wafer transfer operation is continued during an initial stabilization period of the wafer-less autocleaning operation.

In one embodiment, after the initial stabilization period, the wafer-less autocleaning operation includes applying power to the TCP coil at a wattage higher than the applied power during the first wafer transfer operation.

In one embodiment, the plasma limiting condition is defined by a pressure of less than about 5 millitorr of nitrogen gas.

In one embodiment, applying power to the TCP coil during the first wafer transfer operation is at about 500 to about 1000 Watts.

In another embodiment, a method for controlling thermal cycling of a faraday shield in a plasma process chamber is provided. The method includes the following operations: performing a first plasma processing operation on a first wafer in the plasma process chamber; terminating the first plasma processing operation; performing a first wafer transfer operation to transfer the first wafer out of the chamber; during the first wafer transfer operation, applying power to a TCP coil under a plasma limiting condition; performing a second wafer transfer operation to transfer a second wafer into the plasma process chamber; during the second wafer transfer operation, applying power to the TCP coil under a plasma limiting condition; and performing a second plasma processing operation on the second wafer in the plasma process chamber.

In one embodiment, applying power to the TCP coil during the first and second wafer transfer operations prevents a drop in temperature greater than about 10 degrees Centigrade of a faraday shield of the plasma process chamber, the drop in temperature defined from a peak temperature of the faraday shield achieved during the first plasma processing operation.

In one embodiment, the method further includes: after the first wafer transfer operation, and prior to the second wafer transfer operation, performing a wafer-less autocleaning operation.

In one embodiment, applying power to the TCP coil during the first wafer transfer operation is continued during an initial stabilization period of the wafer-less autocleaning operation.

In one embodiment, after the initial stabilization period, the wafer-less autocleaning operation includes applying power to the TCP coil at a wattage higher than the applied power during the first wafer transfer operation.

In one embodiment, the plasma limiting condition is defined by a pressure of less than about 5 millitorr of nitrogen gas; and applying power to the TCP coil during the first wafer transfer operation is at about 500 to about 1000 Watts.

In another embodiment, a method for controlling thermal cycling of a faraday shield in a plasma process chamber is provided. The method includes the following operations: performing a first plasma processing operation on a first wafer in the plasma process chamber; terminating the first plasma processing operation; performing a first wafer transfer operation to transfer the first wafer out of the chamber; during the first wafer transfer operation, applying power to a TCP coil at about 500 to about 1000 Watts under a plasma limiting condition; performing a wafer-less autocleaning operation.

In one embodiment, applying power to the TCP coil during the first wafer transfer operation prevents a drop in temperature greater than about 10 degrees Centigrade of a faraday shield of the plasma process chamber, the drop in temperature defined from a peak temperature of the faraday shield achieved during the first plasma processing operation.

In one embodiment, applying power to the TCP coil during the first wafer transfer operation is continued during an initial stabilization period of the wafer-less autocleaning operation.

In one embodiment, after the initial stabilization period, the wafer-less autocleaning operation includes applying power to the TCP coil at a wattage higher than the applied power during the first wafer transfer operation.

In one embodiment, the method further includes: performing a second wafer transfer operation to transfer a second wafer into the plasma process chamber; during the second wafer transfer operation, applying power to the TCP coil under a plasma limiting condition; and performing a second plasma processing operation on the second wafer in the plasma process chamber.

In one embodiment, the plasma limiting condition is defined by a pressure of less than about 5 millitorr of nitrogen gas.

BRIEF DESCRIPTION OF THE DRAWINGS

The invention, together with further advantages thereof, may best be understood by reference to the following description taken in conjunction with the accompanying drawings.

DETAILED DESCRIPTION

Disclosed is a method for controlling the temperature of a faraday shield to reduce thermal cycling and thereby reduce particle generation in a plasma process chamber.

In the following description, numerous specific details are set forth in order to provide a thorough understanding of the present invention. However, it will be apparent to one skilled in the art that the present invention may be practiced without some of these specific details. In other instances, well known process operations and implementation details have not been described in detail in order to avoid unnecessarily obscuring the invention.

Figure 1A:
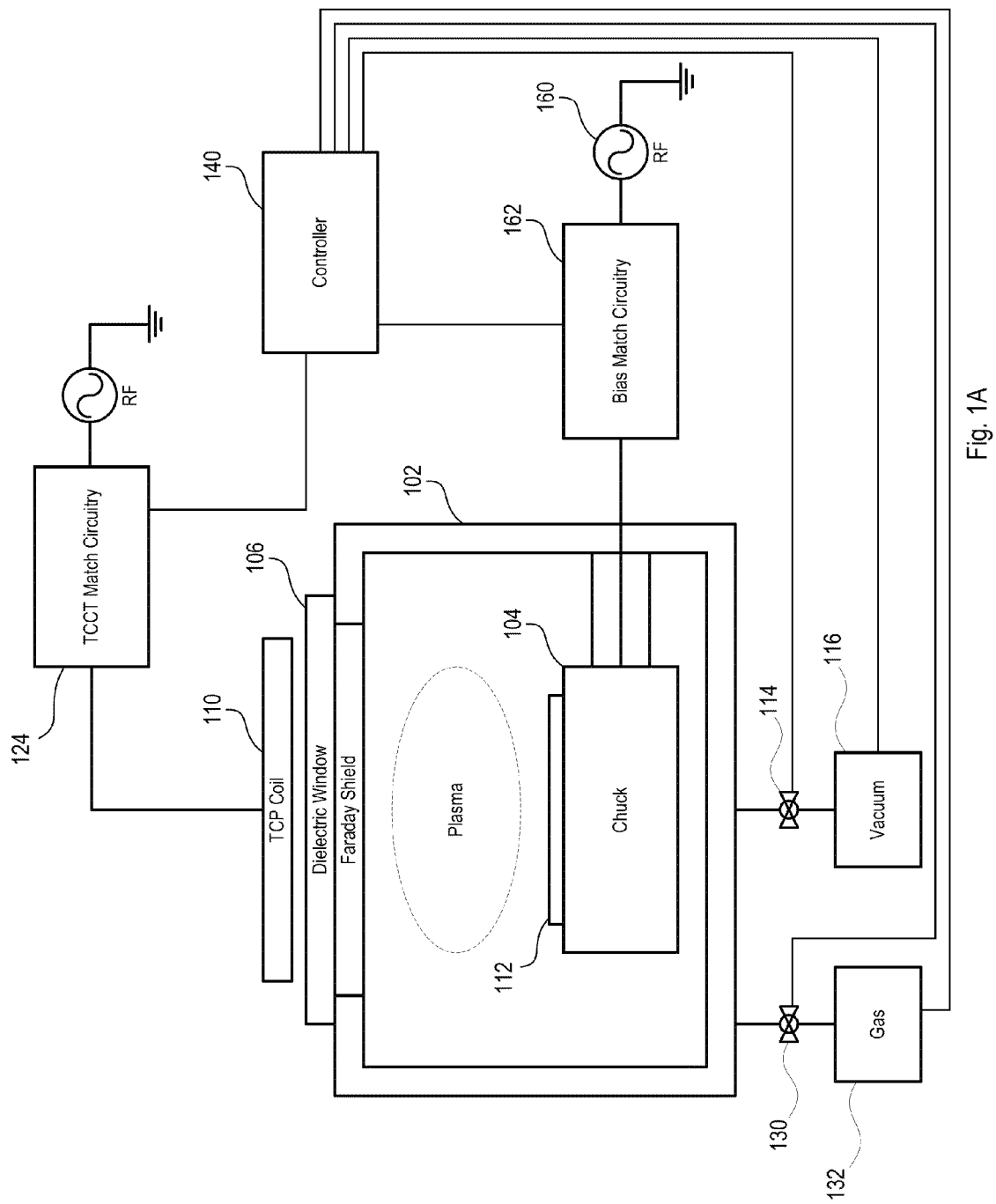
FIG. 1A is a schematic cross-section diagram showing a plasma processing system utilized for etching operations, in accordance with one embodiment of the present invention.

FIG. 1A is a schematic cross-section diagram showing a plasma processing system utilized for etching operations, in accordance with one embodiment of the present invention. The system includes a chamber 100 that includes a chamber body 102, a chuck 104, and a dielectric window 106. The chuck 104 can be an electrostatic chuck for supporting a substrate/wafer 112. An internal faraday shield 108 is disposed inside the chamber 100 beneath the dielectric window 106. A TCP coil 110 is disposed over the dielectric window, and is connected to TCCT match circuitry 124.

Further shown is a bias RF generator 160, which can be defined from one or more generators. If multiple generators are provided, different frequencies can be used to achieve various tuning characteristics. A bias match 162 is coupled between the RF generators 160 and a conductive plate of the assembly that defines the chuck 104. The chuck 104 also includes electrostatic electrodes to enable the chucking and dechucking of the wafer. Broadly, a filter and a DC clamp power supply can be provided. Other control systems for lifting the wafer off of the chuck 104 can also be provided. For example, lift pins may be defined in the chuck 104 for lifting a wafer from the chuck.

A gas supply 132 provides a process gas to the chamber. It should be appreciated that multiple gas supplies may be provided for supplying different gases to the chamber for various types of operations, such as process operations on wafers, waferless autocleaning operations, and other operations. A valve 130 controls the flow of gas from the gas supply 132 into the chamber 102.

A vacuum pump 116 is connected to the chamber 102 to enable vacuum pressure control and removal of gaseous byproducts from the chamber during operational plasma processing. A valve 114 is disposed between chamber 102 and the vacuum pump 116 to control the amount of vacuum suction being applied to the chamber.

The dielectric window 106 can be defined from a ceramic type material. Other dielectric materials are also possible, so long as they are capable of withstanding the conditions of a semiconductor etching chamber. Typically, chambers operate at elevated temperatures ranging between about 50 Celsius and about 200 Celsius. The temperature will depend on the etching process operation and specific recipe. The chamber 102 will also operate at vacuum conditions in the range of between about 1 m Torr (mT) and about 100 m Torr (mT). Although not all specifically shown, chamber 102 is typically coupled to facilities when installed in a clean room, or a fabrication facility. Facilities include plumbing that provide processing gases, vacuum, temperature control, and environmental particle control.

These facilities are coupled to chamber 102, when installed in the target fabrication facility. Additionally, chamber 102 may be coupled to a transfer chamber that will enable robotics to transfer semiconductor wafers into and out of chamber 102 using typical automation.

A programmable controller 140 is provided for controlling the operation of the chamber 102 and its associated components. Broadly speaking, the controller 140 can be programmed to execute a chamber operation defined by a recipe. A given recipe may specify various parameters for the operation, such as the application of power to the TCP coils, the flow of gas into the chamber, and the application of vacuum. It should be appreciated that the timing, duration, magnitude, or any other adjustable parameter or controllable feature can be defined by a recipe and carried out by the controller to control the operation of the chamber 102 and its associated components. Additionally, a series of recipes may be programmed into the controller 140.

Figure 1B:
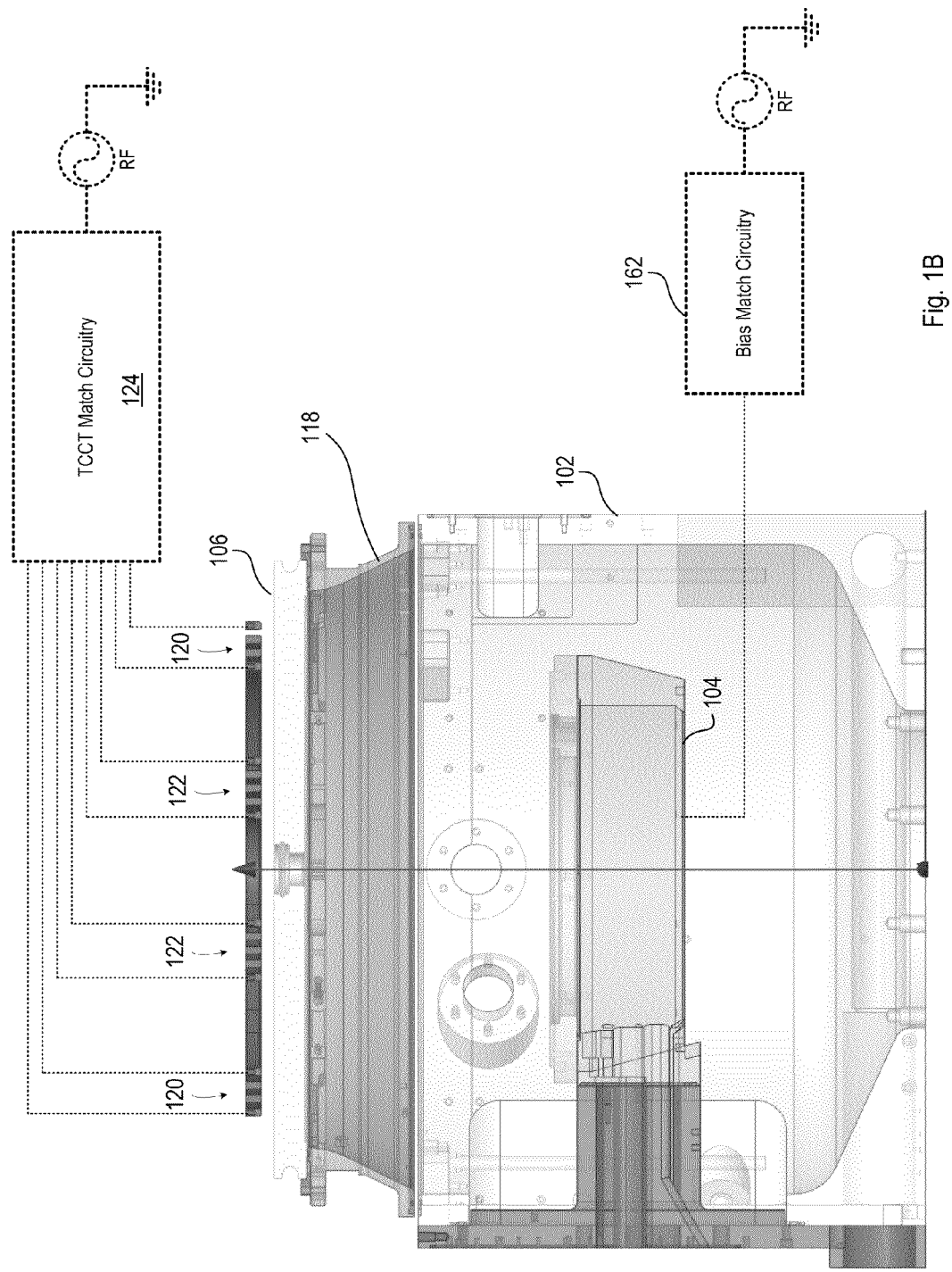
FIG. 1B is a cross-sectional view of a plasma processing chamber, in accordance with an embodiment of the invention.

FIG. 1B is a cross-sectional view of a plasma processing chamber, in accordance with an embodiment of the invention. The TCP coil is shown to include an inner coil (IC) 122, and an outer coil (OC) 120. The TCP coil is placed and arranged over the dielectric window 106.

TCCT match circuitry 124 enables dynamic tuning of power provided to the inner and outer coils. The TCP coil is coupled to the TCCT match circuitry 124 which includes connections to the inner coil 120, and outer coil 122. In one embodiment, the TCCT match circuitry 124 is configured to tune the TCP coil to provide more power to the inner coil 122 versus the outer coil 120. In another embodiment, the TCCT match circuitry 124 is configured to tune the TCP coil to provide less power to the inner coil 122 versus the outer coil 120. In another embodiment, the power provided to the inner coil and the outer coil will be to provide an even distribution of power and/or control the ion density in a radial distribution over the substrate (i.e., wafer, when present). In yet another embodiment, the tuning of power between the outer coil and the inner coil will be adjusted based on the processing parameters defined for the etching being performed on the semiconductor wafer disposed over chuck 104.

In one implementation, the TCCT match circuitry having variable capacitors (as discussed in further detail below) can be configured to be adjusted automatically to achieve a predetermined ratio of currents in the two coils. It should be understood that the circuits illustrated herein provide tuning and adjustment to the desired ratio of currents. In one embodiment, the ratio of currents can range from 0.1 to 1.5. Commonly, this ratio is referred to as the transformer coupled capacitive tuning (TCCT) ratio. The setting of the TCCT ratio, however, is based on the process that is desired for a particular wafer or wafers.

It should be appreciated that by providing a tunable TCP coil, the chamber 102 can provide flexibility for controlling ion density versus TCP power, and radial ion density profiles, depending on the processing operations being performed.

Additionally, it should be noted that although reference is made to a TCCT match circuitry, the use of this terminology should not limit the scope of the circuitry defined to achieve the desired match function and provide for tuning. In other embodiments, it is contemplated that match circuitry in accordance with the principles and embodiments described herein can be applied to achieve a desired match function for plasma processing systems without TCCT functionality, or having a fixed TCCT ratio.

With continued reference to FIG. 1B, a pinnacle 118 of the chamber 100 is shown. The pinnacle 118 defines an upper portion of the chamber which connects from the top of the chamber body 102 to the dielectric window 106 and the faraday shield.

The plasma etching of metals for the manufacture of MRAM is essentially a sputtering process which releases non-volatile metallic etch products, including various metals such as ruthenium (Ru), molybdenum (Mo), titanium (Ti), etc. These metals adhere to the interior surfaces of the plasma process chamber, including the faraday shield, and are problematic if particles from such deposits flake off during subsequent processing operations. As noted, particle generation from residues of previous operations can interfere with chucking of wafers, or may adversely impact yield.

Figure 2:
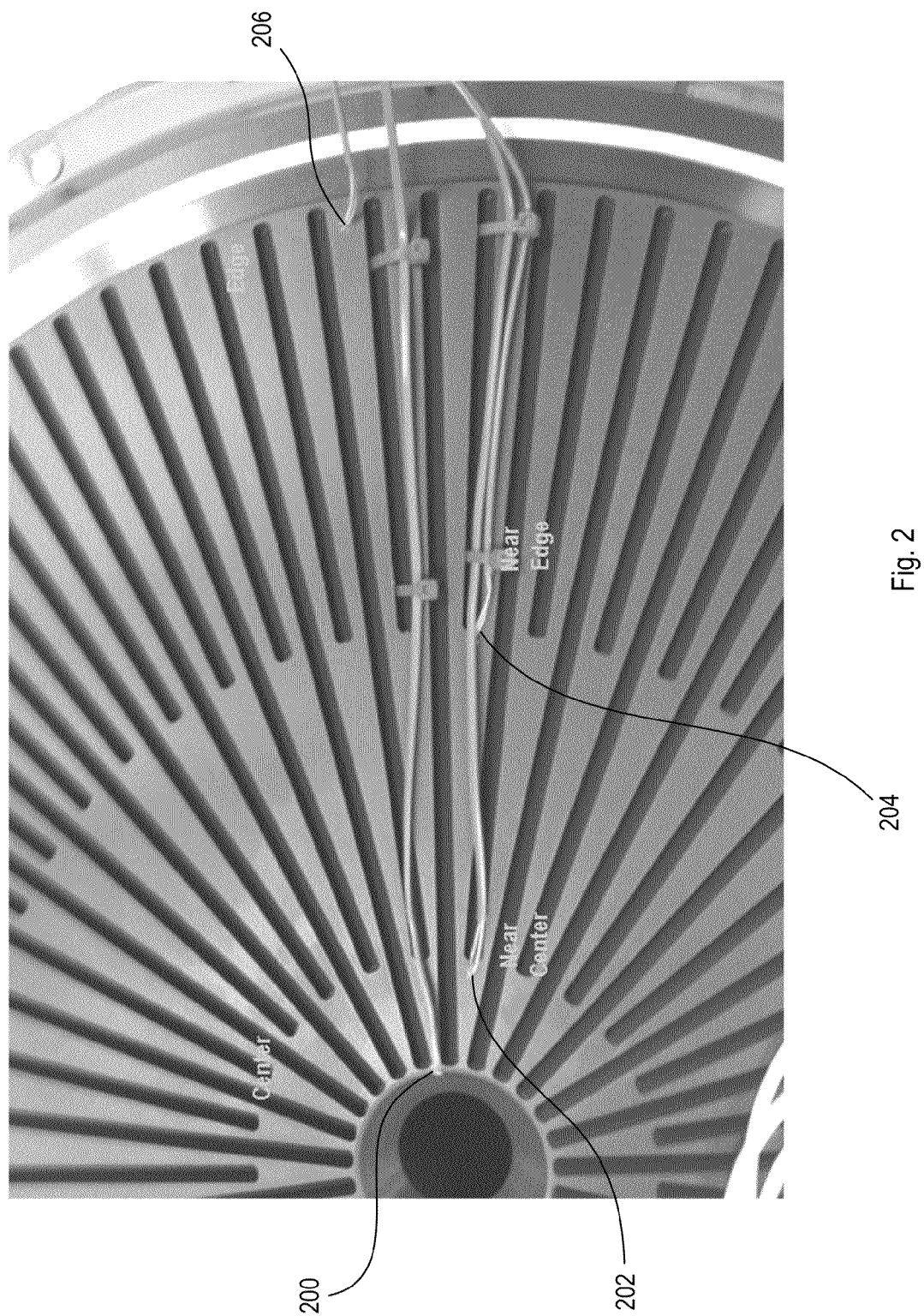
FIG. 2 illustrates a portion of the faraday shield with various thermocouples for measuring temperature affixed thereto, in accordance with an embodiment of the invention.

FIG. 2 illustrates a portion of the faraday shield with various thermocouples for measuring temperature affixed thereto, in accordance with an embodiment of the invention. In the following description, reference is made to temperature measurements taken at various locations on the faraday shield. These locations are defined by reference to the thermocouple attachment points shown at FIG. 2, which define various radial locations along the faraday shield. A center location 200, a near center location 202, a near edge location 204, and an edge location 206 are defined as shown in the illustrated embodiment. In the experimental data described in the present disclosure, temperatures have been measured at these locations along the faraday shield.

Figure 3:
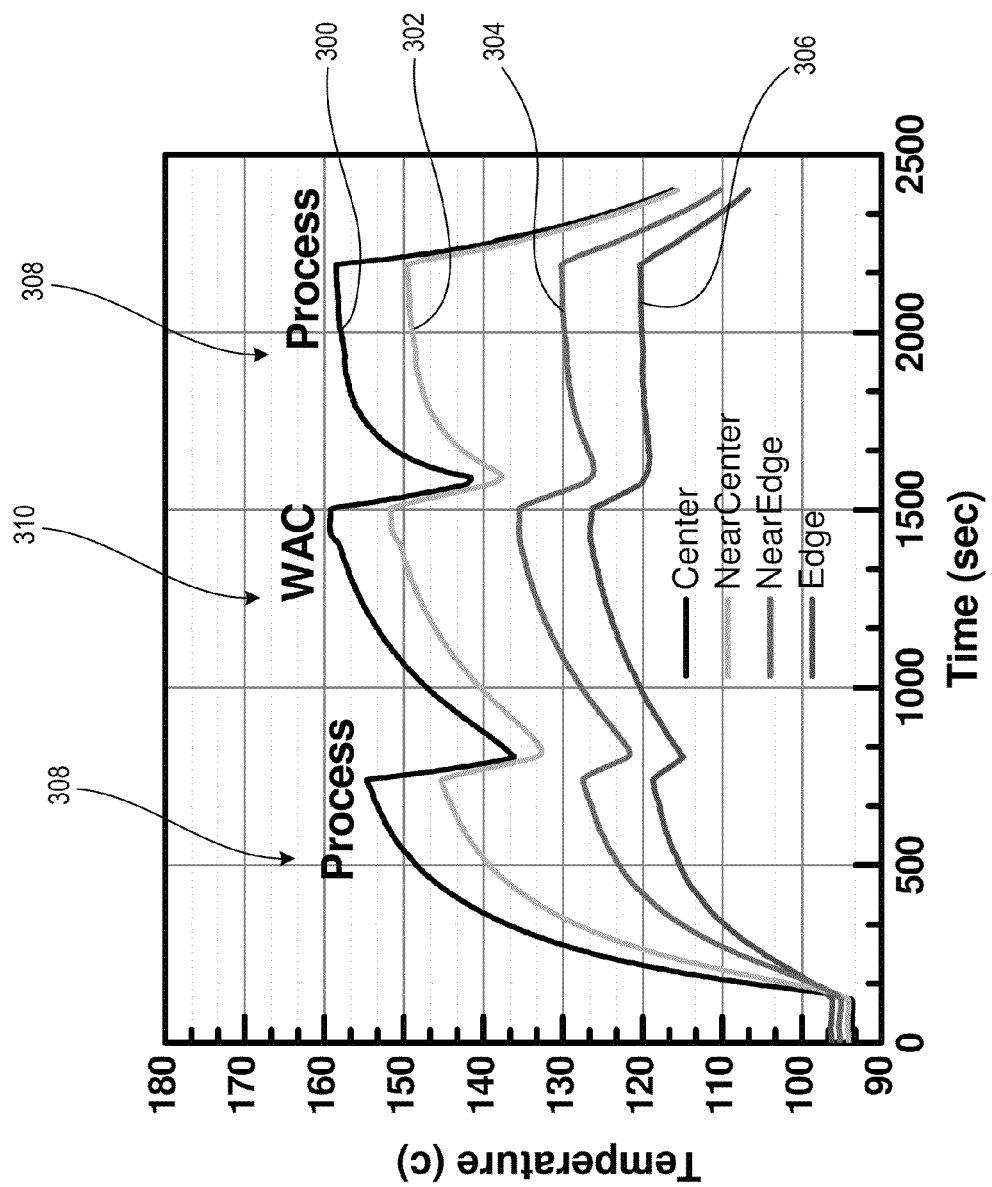
FIG. 3 is a graph of temperature versus time for various locations of the faraday shield, illustrating thermal cycling of the faraday shield during processing and waferless autocleaning operations.

FIG. 3 is a graph of temperature versus time for various locations of the faraday shield, illustrating thermal cycling of the faraday shield during processing and waferless autocleaning operations. The curves 300, 302, 304, and 306 illustrate the temperature measured at the center, near center, near edge, and edge, respectively. The process operation recipe is as follows: 2 mT, 1000 W TCP, TCCT=0.5, 1200 Wb, 100 sccm $NH_3$, equal, for 600 seconds. The waferless autoclean (WAC) operation recipe is as follows: 15 mT, 1800 W TCP, 200 sccm $O_2$, for 600 seconds; and, 10 mT, 1800 W TCP, 500 sccm $H_2$, for 100 seconds.

In the illustrated graph, a process operation was performed, followed by a WAC operation, followed by another process operation. Each operation produces a rise in temperature followed by a abrupt fall in temperature as measured at the faraday shield. The region 308 of the graph illustrates the temperature change during the first process operation; the region 310 illustrates the temperature change during the WAC operation; and, the region 312 illustrates the temperature changes during the second process operation. As can be seen, there is a temperature delta of about 35 degrees Celsius between the center location of the faraday shield and the edge location observed during the process operation. The highest thermal cycling is observed at the center location of the faraday shield, where the temperature cycles by about 20 degrees Celsius. The lowest thermal cycling is observed at the edge location of the faraday shield, where the temperature cycles by about seven degrees Celsius. These thermal cycling amounts also correspond to the amount of etch product deposition observed, with the highest amounts observed at the center location and the lowest amounts observed at the edge location.

Figure 4:
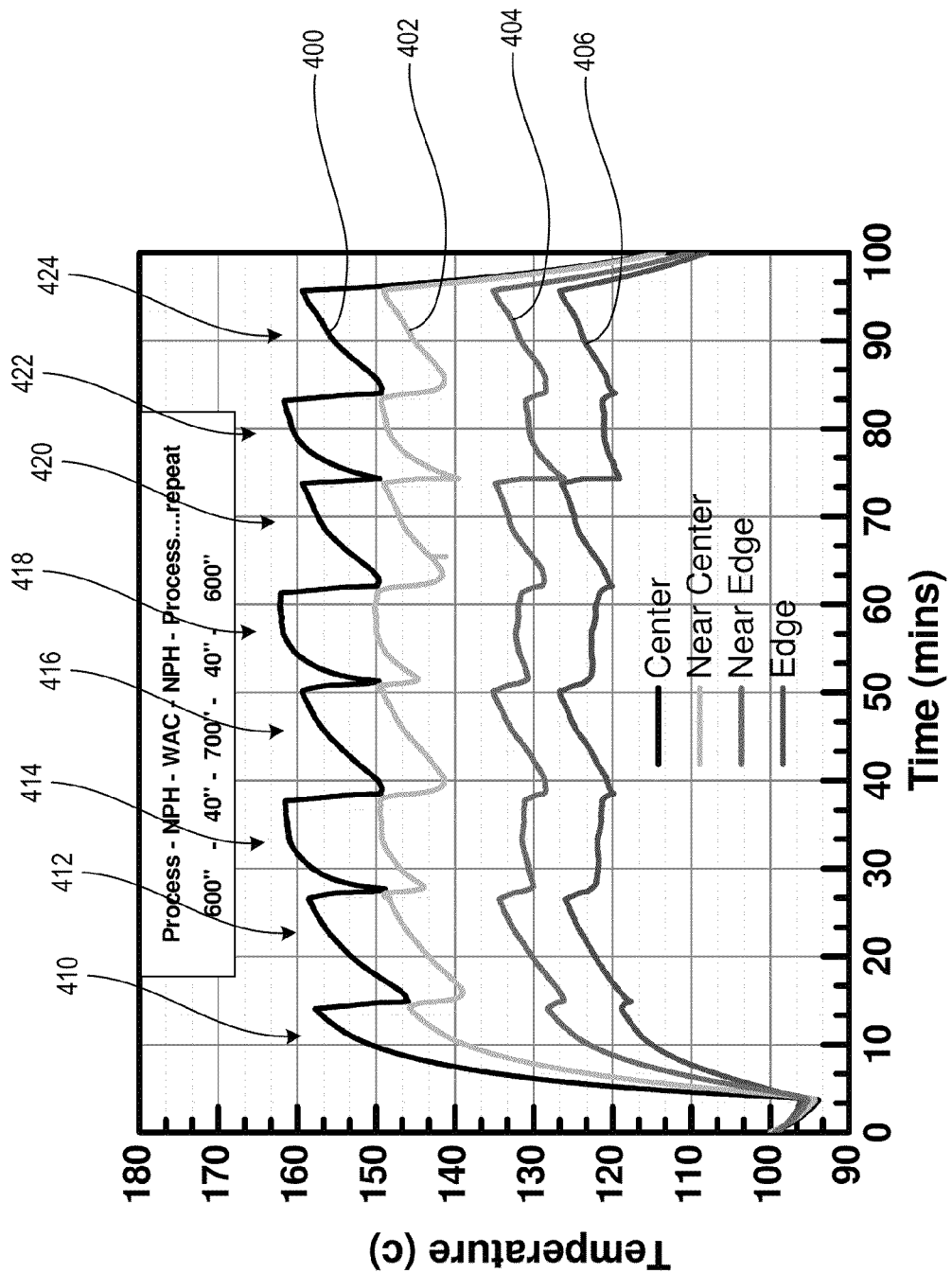
FIG. 4 is a graph of temperature versus time for various locations of the faraday shield, wherein successive process operations and waferless autoclean operations are alternated with a no-plasma heating condition, in accordance with an embodiment of the invention.

FIG. 4 is a graph of temperature versus time for various locations of the faraday shield, wherein successive process operations and waferless autoclean operations are alternated with a no-plasma heating condition, in accordance with an embodiment of the invention. Applicants have discovered that by applying power to the TCP coils following process operations or WAC operations, under a chamber condition that yields limited or no plasma, it is possible to reduce the thermal cycling of the faraday shield. For purposes of the present disclosure, this application of power for purposes of limiting the amount of thermal cycling is described as a no-plasma heating (NPH) operation.

With continued reference to FIG. 4, the process recipe is as follows: 2 mT, 1000 W TCP, TCCT=0.5, 1200 Wb, 100 sccm $NH_3$, equal, for 600 seconds. The WAC recipe is as follows: 15 mT, 1800 W TCP, 200 sccm $O_2$, for 600 seconds; and, 10 mT, 1800 W, 500 sccm $H_2$, for 100 seconds. The NPH recipe is as follows: approximately 1.5 mT (maximum vacuum condition with valve 114 set to completely open), 1 sccm $N_2$, 600 W, for 40 seconds. Process operations were alternated with WAC operations, but with an NPH operation following each process/WAC operation, thus yielding the following series of operations: process, NPH, WAC, NPH, process, NPH, WAC, NPH, etc.

The curves 400, 402, 404, and 406 illustrate the temperature of the faraday shield measured at the center, near center, near edge, and edge locations, respectively. It will be appreciated that the temperature profile (most noticeable at the center location) is characterized by a series of temperature rises corresponding to the process and WAC operations, with dips in temperature occurring in between, during which the NPH operation is performed. The process operations are approximately shown by reference numerals 410, 414, 418, and 420; whereas the WAC operations are approximately shown by reference numerals 412, 416, 418, 420, and 424. As can be seen, the amount of thermal cycling of the faraday shield is significantly reduced as compared to that shown and described with reference to FIG. 3. The introduction of a NPH operation between successive alternating process and WAC operations prevents the temperature of the faraday shield from declining as much as would otherwise occur in the absence of the NPH operation.

Figure 5A:
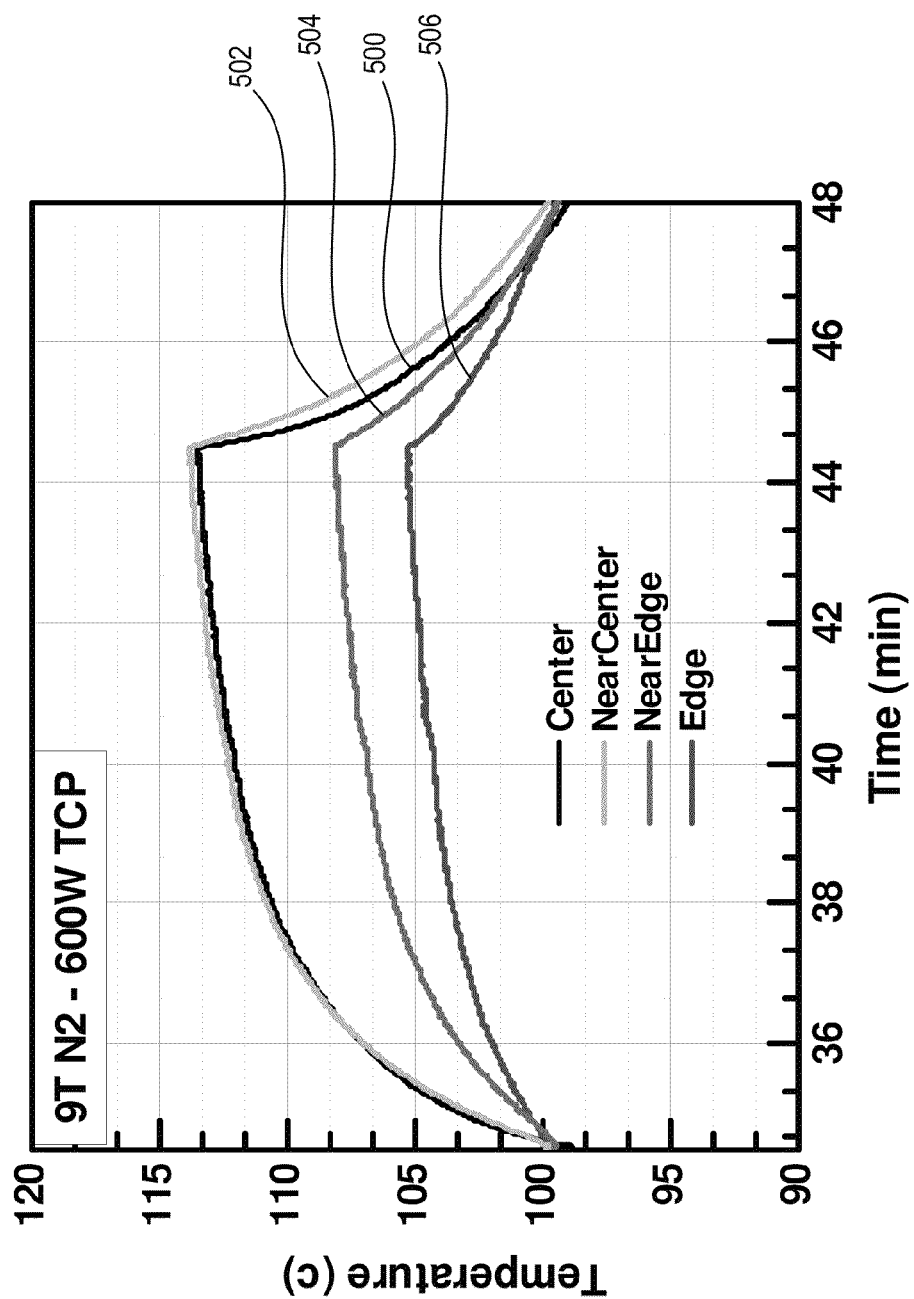
FIGS. 5A and 5B illustrate graphs of temperature versus time for the faraday shield, showing different rates of temperature change at different chamber pressures, in accordance with embodiments of the invention.
Figure 5B:
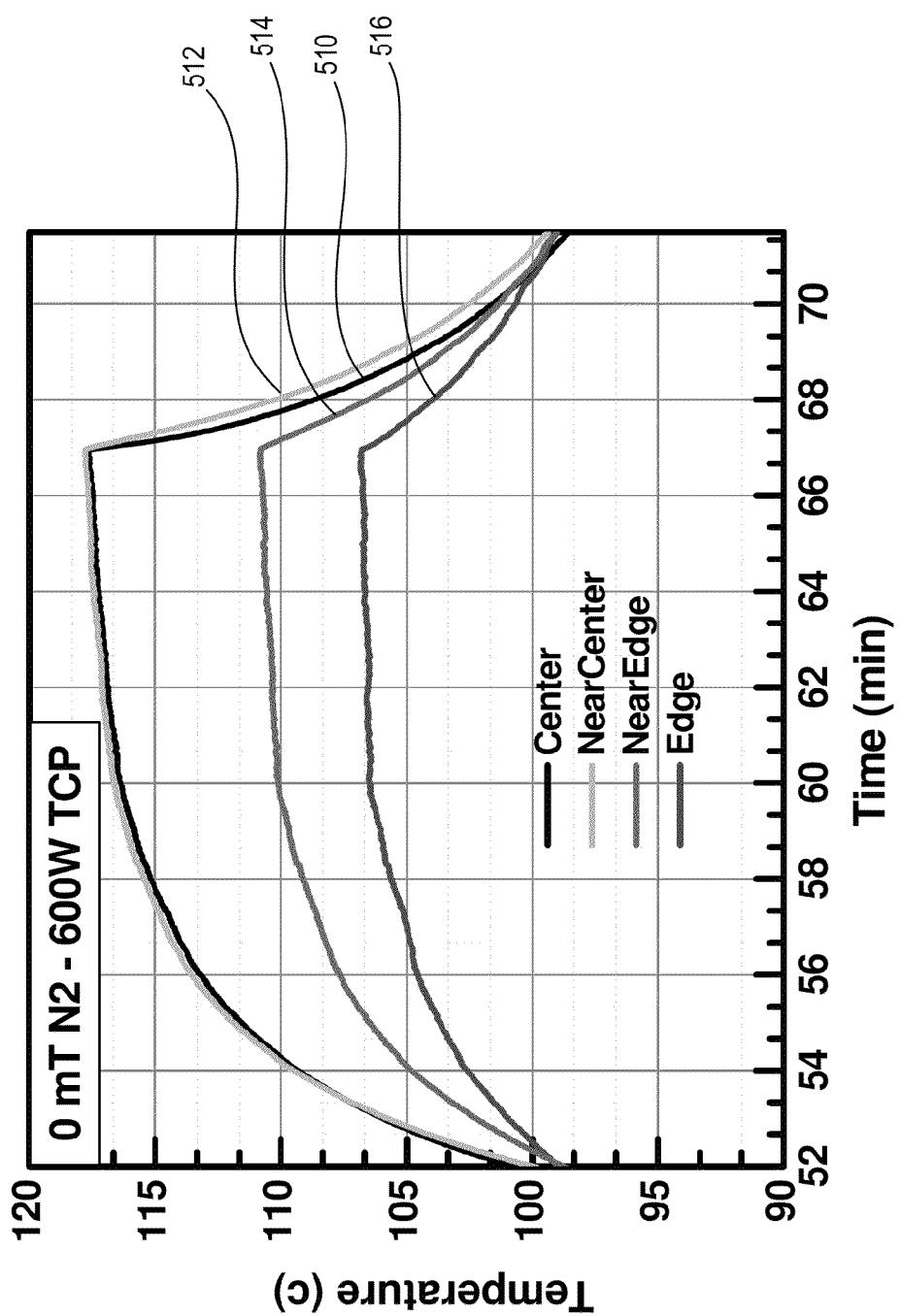

FIGS. 5A and 5B illustrate graphs of temperature versus time for the faraday shield, showing different rates of temperature change at different chamber pressures, in accordance with embodiments of the invention. For the graph shown at FIG. 5A, the following recipe was applied: 9 T $N_2$, 600 W TCP (Vp=3800 V, total coil current=69 A (inner coil=21 A, outer coil=48 A)). The curves 500, 502, 504, and 506 correspond to the temperature measured at the center, near center, near edge, and edge locations, respectively. Whereas for the graph shown at FIG. 5B, the following recipe was applied: 0 mT $N_2$, 600 W TCP (Vp=3800 V, total coil current=69 A (inner coil=21 A, outer coil=48 A)). The curves 510, 512, 514, and 516 illustrate the temperature measured at the center, near center, near edge, and edge locations, respectively. The recipes differ in terms of the chamber pressure parameter. As shown by the temperature graphs of FIGS. 5A and 5B, the faraday shield heats up at a higher rate under the lower pressure condition (0 T) than at the higher pressure condition (9 T). This difference in the rate of heating can be attributed to higher temperature loss to $N_2$ at higher pressure. The faraday shield's center location heats up by approximately 16 degrees Celsius in 10 minutes at 0 T. It is additionally noted that the difference in temperature between the center and the edge of the faraday shield can be adjusted by changing TCCT, in accordance with embodiments of the invention.

Figure 6A:
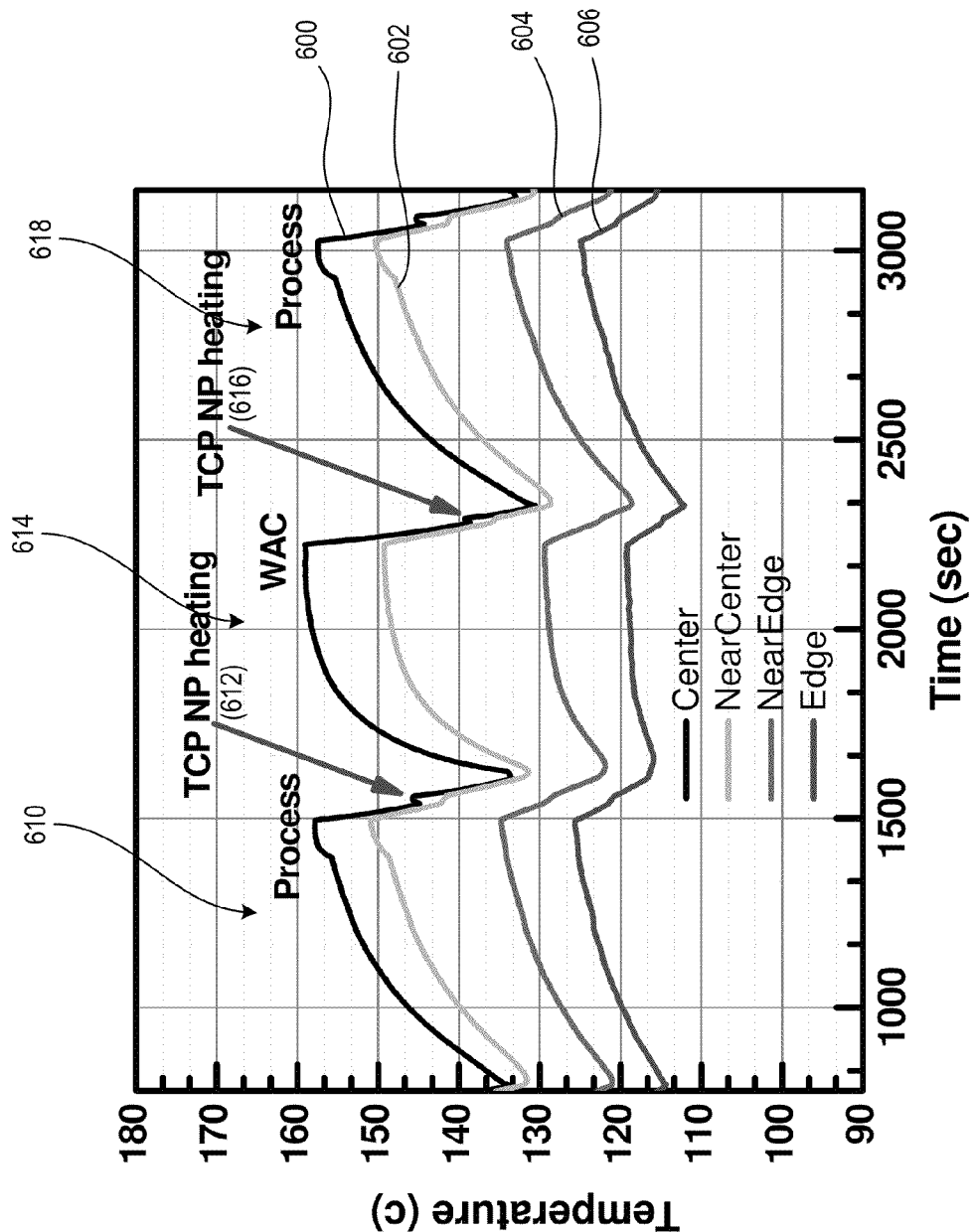
FIG. 6A is a graph of temperature versus time for the faraday shield, showing changes in temperature during alternating process and WAC operations, interspersed with a no-plasma/limited plasma heating operation, in accordance with an embodiment of the invention.

FIG. 6A is a graph of temperature versus time for the faraday shield, showing changes in temperature during alternating process and WAC operations, interspersed with a no-plasma/limited plasma heating operation, in accordance with an embodiment of the invention. The recipe for the process operation is as follows: 2 mT, 1000 W TCP, TCCT=0.5, 1200 Wb, 100 sccm $NH_3$, equal, for 600 seconds. The recipe for the WAC operation is as follows: 15 mT, 1800 W TCP, 200 sccm $O_2$, for 600 seconds; and, 10 mT, 1800 W, 500 sccm $H_2$, for 100 seconds. The recipe for the NPH operation is as follows: approximately 1.5 mT (exhaust valve fully open for maximum vacuum application), 1 sccm $N_2$, 600 W, for 40 seconds. The temperature curves 600, 602, 604, and 606 illustrate the temperatures at the center, near center, near edge, and edge locations of the faraday shield, respectively. The sequence of operations shown includes a process operation (reference 610), a NPH operation (reference 612), a WAC operation (reference 614), a NPH operation (reference 616), and a process operation (reference 618). As can be seen, the NPH operations shown at reference 612 and 616 reduce the amount that the temperature of the faraday shield drops following either of the process or WAC operations.

Figure 6B:
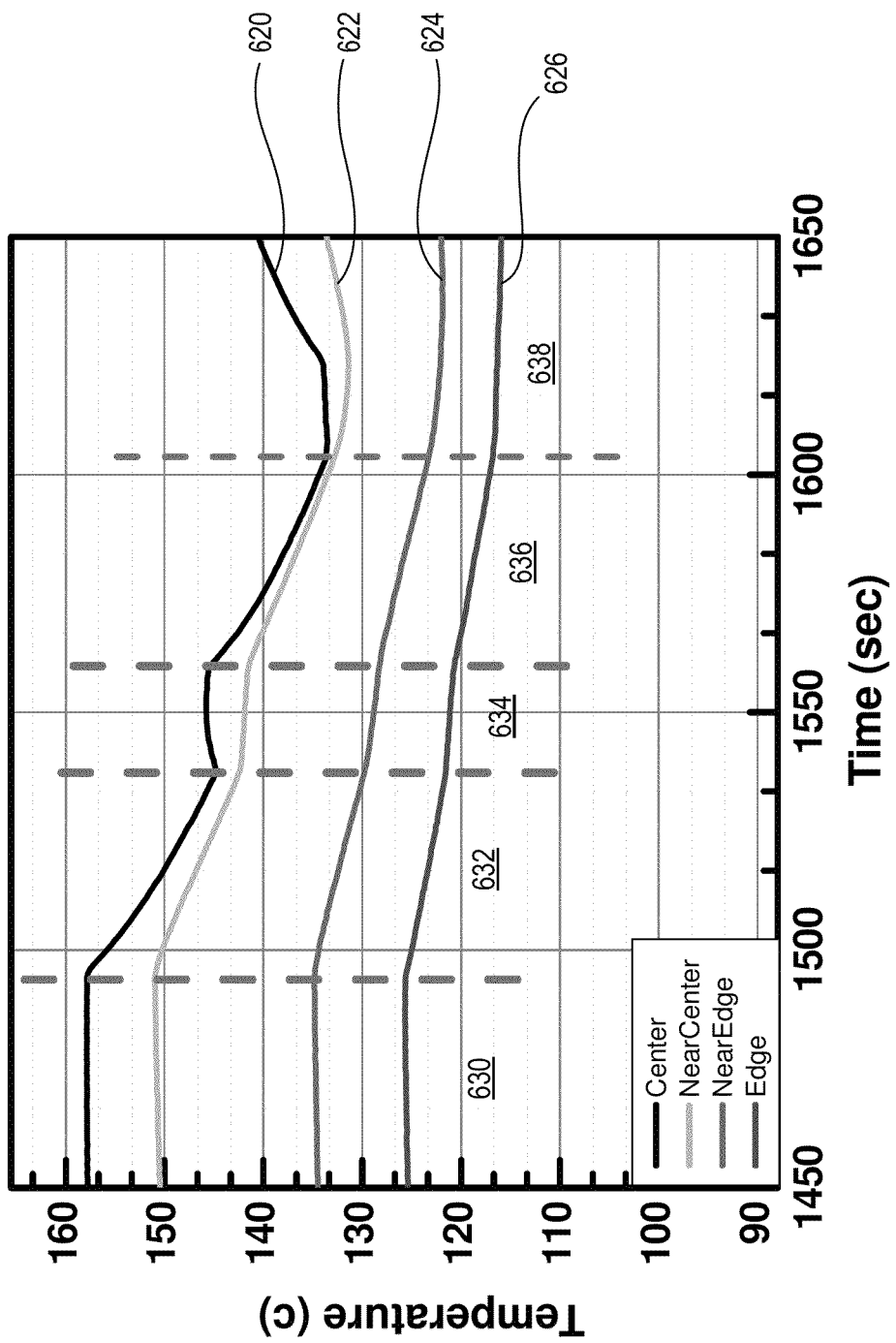
FIG. 6B shows an expanded view of a portion of the graph shown at 6A, highlighting the effect of the NPH operation, in accordance with an embodiment of the invention.

FIG. 6B shows an expanded view of a portion of the graph shown at 6A, highlighting the effect of the NPH operation. The curves 620, 622, 624, and 626 illustrate the temperatures of the faraday shield at the center, near center, near edge, and edge locations, respectively. Various regions are shown to illustrate the effect of the NPH operation occurring in between process and WAC operations. At region 630, the process operation ends. At region 632, there is approximately six seconds for dechucking, plus approximately 11 seconds of recipe load time, plus approximately 10 seconds of stabilization time. During these times, the temperature of the faraday shield falls. At region 634, the NPH operation occurs, reducing the rate at which the temperature of the faraday shield falls, or in the case of the center location of the faraday shield, increasing the temperature. At region 636, the WAC operation is started, including recipe load time and stabilization time. During these times, the temperature of faraday shield continues to fall. At region 638, the application of power to the TCP coils for the WAC operation begins, causing the temperature of the faraday shield to rise.

Figure 7A:
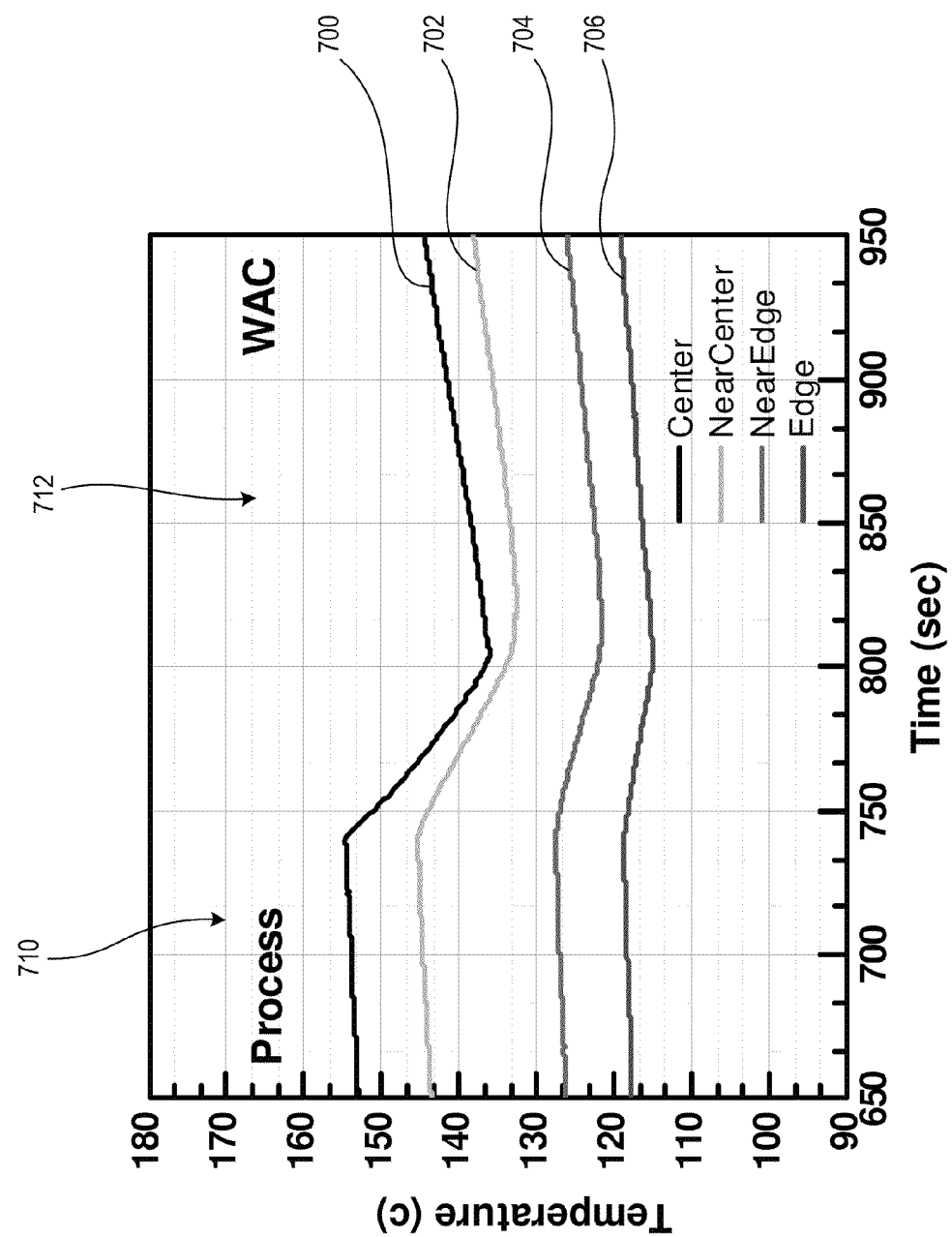
FIGS. 7A and 7B are graphs of temperature versus time for the faraday shield, illustrating the effect of applying a no-plasma heating operation between a process operation and a WAC operation, in accordance with an embodiment of the invention.
Figure 7B:
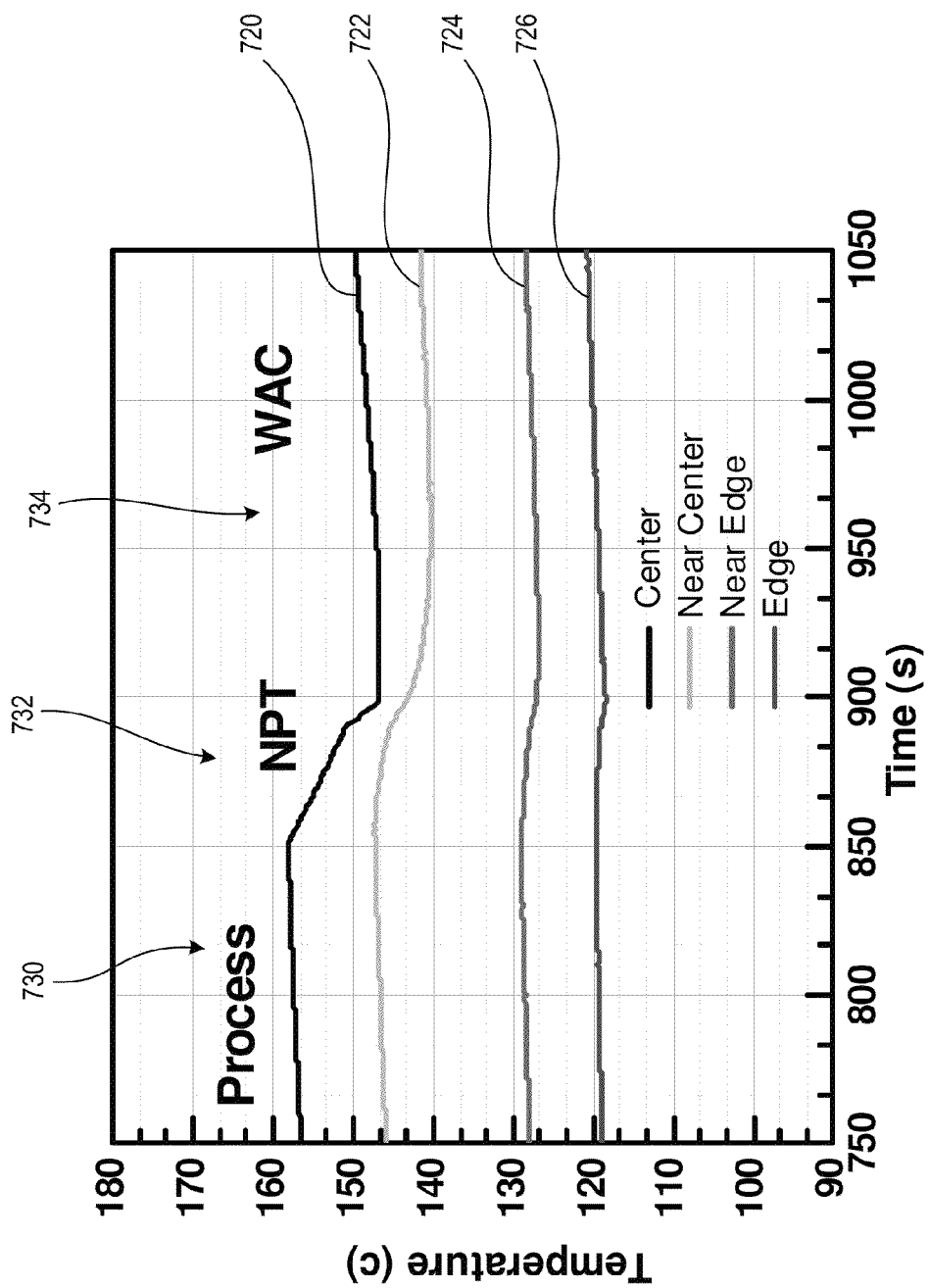

FIGS. 7A and 7B are graphs of temperature versus time for the faraday shield, illustrating the effect of applying a no-plasma heating operation between a process operation and a WAC operation, in accordance with an embodiment of the invention. With reference to FIG. 7A, curves 700, 702, 704, and 706 illustrate the temperature of the faraday shield as measured at the center, near center, near edge, and edge locations, respectively. In the region 710, a process operation is performed, and in the region 712, a WAC operation is performed. The recipe for the process operation is as follows: 2 mT, 1000 W TCP, TCCT=0.5, 1200 Wb, 100 sccm $NH_3$, equal, for 600 seconds. The recipe for the WAC operation is as follows: 15 mT, 1800 W TCP, 200 sccm $O_2$, for 600 seconds; and, 10 mT, 1800 W, 500 sccm $H_2$, for 100 seconds. No NPH operation is performed between the process and WAC operations.

By contrast, FIG. 7B illustrates the temperature of the faraday shield with a NPH operation performed between the process operation and the WAC operation. The curves 720, 722, 724, and 726 illustrate the temperatures measured at the center, near center, near edge, and edge locations of the faraday shield, respectively. At region 730, the process operation is performed; at region 732, the NPH operation is performed; and at region 734, the WAC operation is performed. The NPH operation is performed for approximately 40 seconds, so as to occur during the following combined times: dechucking (approximately 7 seconds), transfer time (approximately 24 seconds), and WAC stabilization time (approximately 9 seconds). Thus, during these times, power is applied to the TCP coils under a plasma limiting condition to reduce the temperature drop of the faraday shield that would otherwise normally occur. Comparing the temperatures of the faraday shield shown at FIG. 7B with those of FIG. 7A, it can be seen that the thermal cycling of the faraday shield is significantly reduced. The drop in temperature occurring between the end of the process operation and the beginning of the WAC operation's power application is reduced.

It will be appreciated that the specific conditions applied for a no-plasma/limited plasma heating operation, for the purpose of reducing the magnitude of thermal cycling in the process chamber, may vary in accordance with various embodiments of the invention. By way of example, a NPH operation may be defined with the following parameter ranges: about 0.5 to about 5 mT, about 0.5 to about 10 sccm $N_2$, about 400 to about 1800 W TCP. In one embodiment, the pressure range is about 1 to about 3 mT. In another embodiment, the pressure is about 1.5 mT. In one embodiment the $N_2$ is supplied at about 1 to about 5 sccm. In another embodiment, the $N_2$ is supplied at about 1 sccm. In one embodiment, the TCP power is applied at about 500 W to about 1000 W. In another embodiment, the TCP power is applied at about 600 W.

Furthermore, while $N_2$ is utilized in the above-described embodiments, it will be appreciated that other gases may be substituted, provided that such gases produce no plasma or very limited plasma at the desired parameters.

While embodiments of the invention have been described with reference to a chamber heating operation that produces no plasma or very limited plasma, it will be appreciated that in other embodiments, a plasma generating heating operation can be defined to heat the process chamber, and reduce thermal cycling of the faraday shield.

Figure 8:
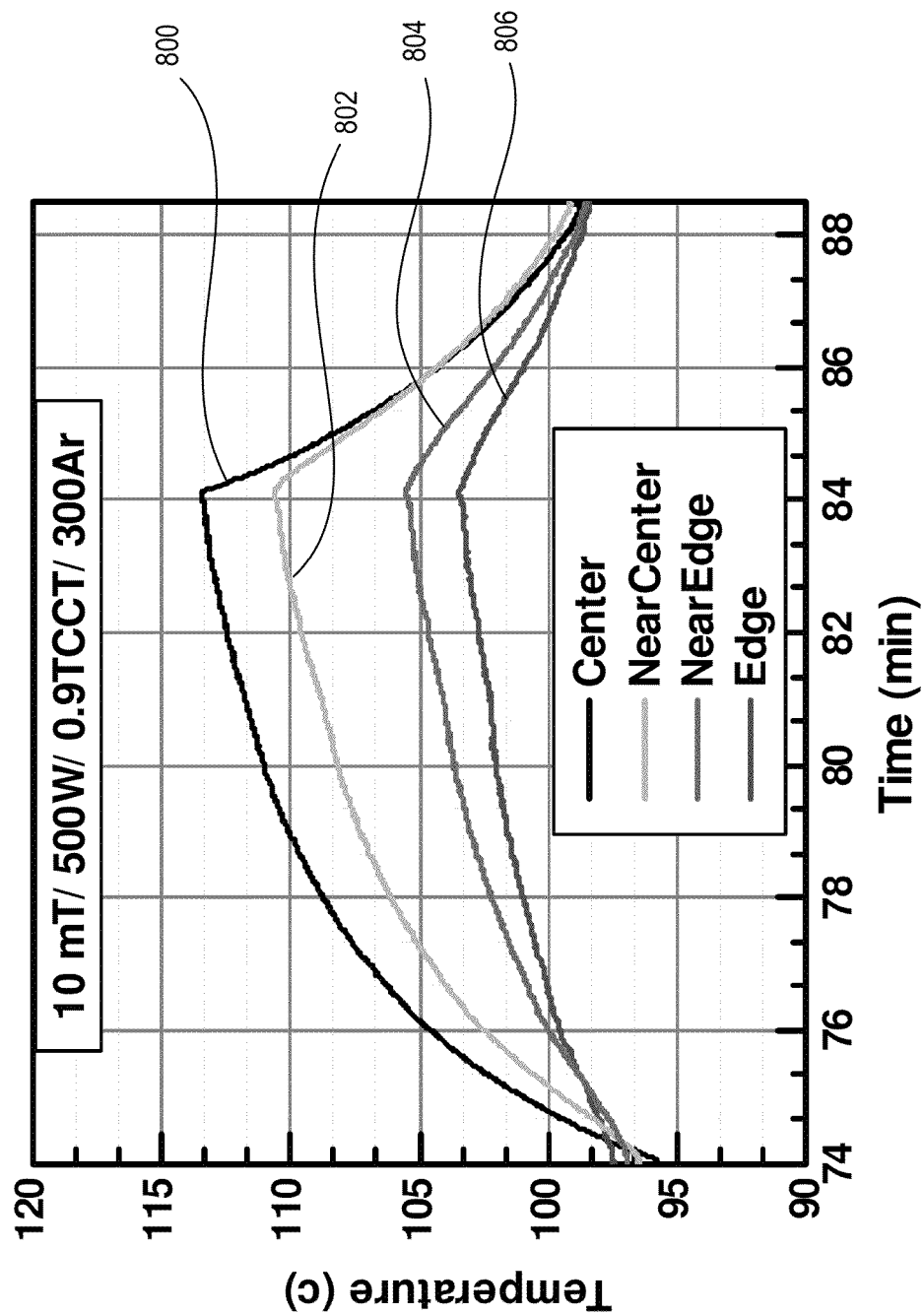
FIG. 8 is a graph of temperature versus time for the faraday shield, showing the rise in temperature of the faraday shield during a plasma heating operation, in accordance with an embodiment of the invention.

FIG. 8 is a graph of temperature versus time for the faraday shield, showing the rise in temperature of the faraday shield during a plasma heating operation, in accordance with an embodiment of the invention. The recipe for the plasma heating operation is as follows: 10 mT, 500 W, 0.9 TCCT, 300 sccm Ar. The curves 800, 802, 804, and 806 illustrate the temperature of the faraday shield at the center, near center, near edge, and edge locations, respectively. As shown, the faraday shield can be heated through the application of TCP power under a plasma producing chamber condition. In the described embodiment, Ar gas is provided, which generates an argon plasma during the heating operation. However, in other embodiments, other gases can be applied which produce benign plasmas, such as nitrogen, oxygen, helium, etc.

Figure 9A:
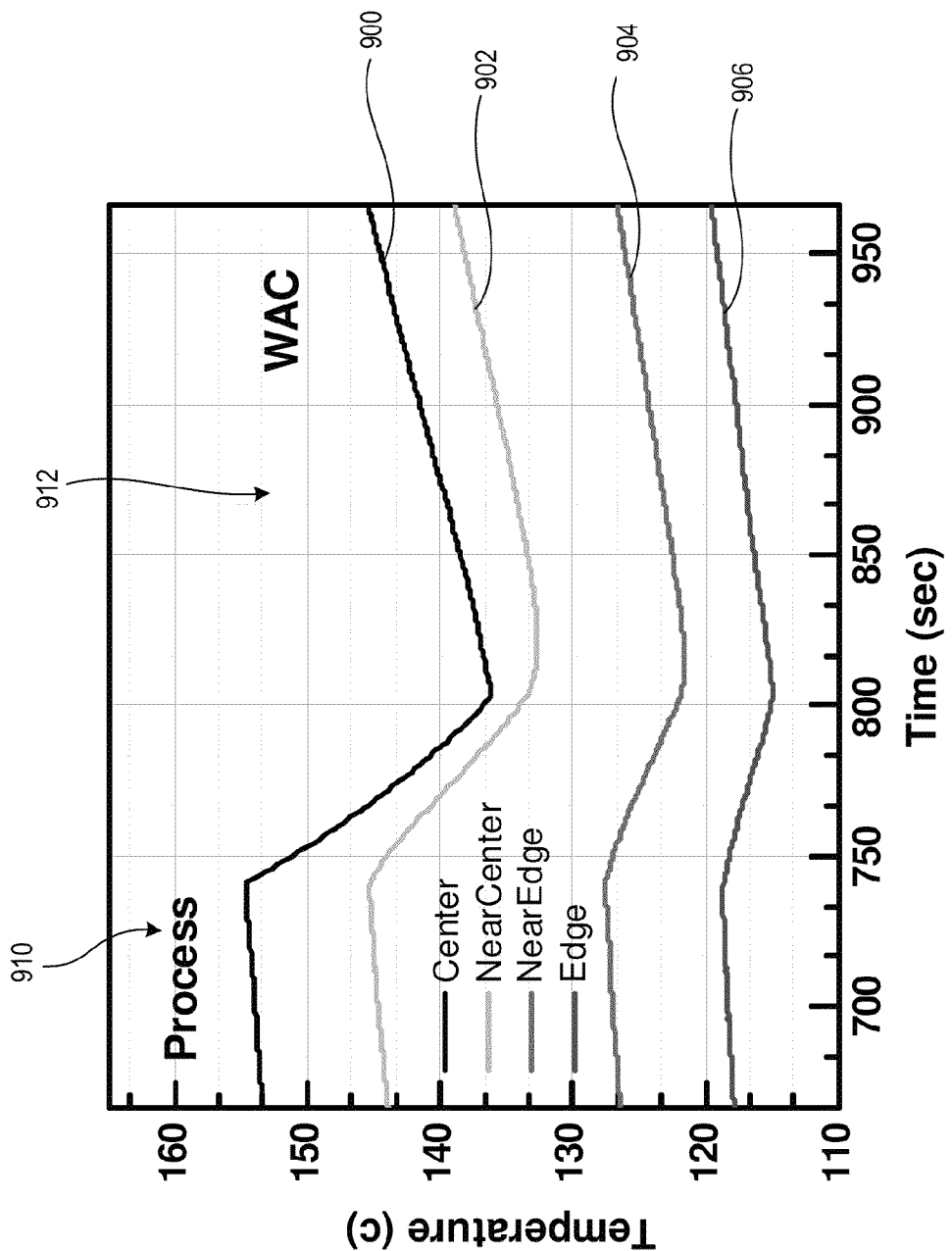
FIGS. 9A and 9B illustrate the temperature drop occurring between a process operation and a WAC operation, demonstrating the effect of a plasma heating operation in reducing thermal cycling, in accordance with an embodiment of the invention.
Figure 9B:
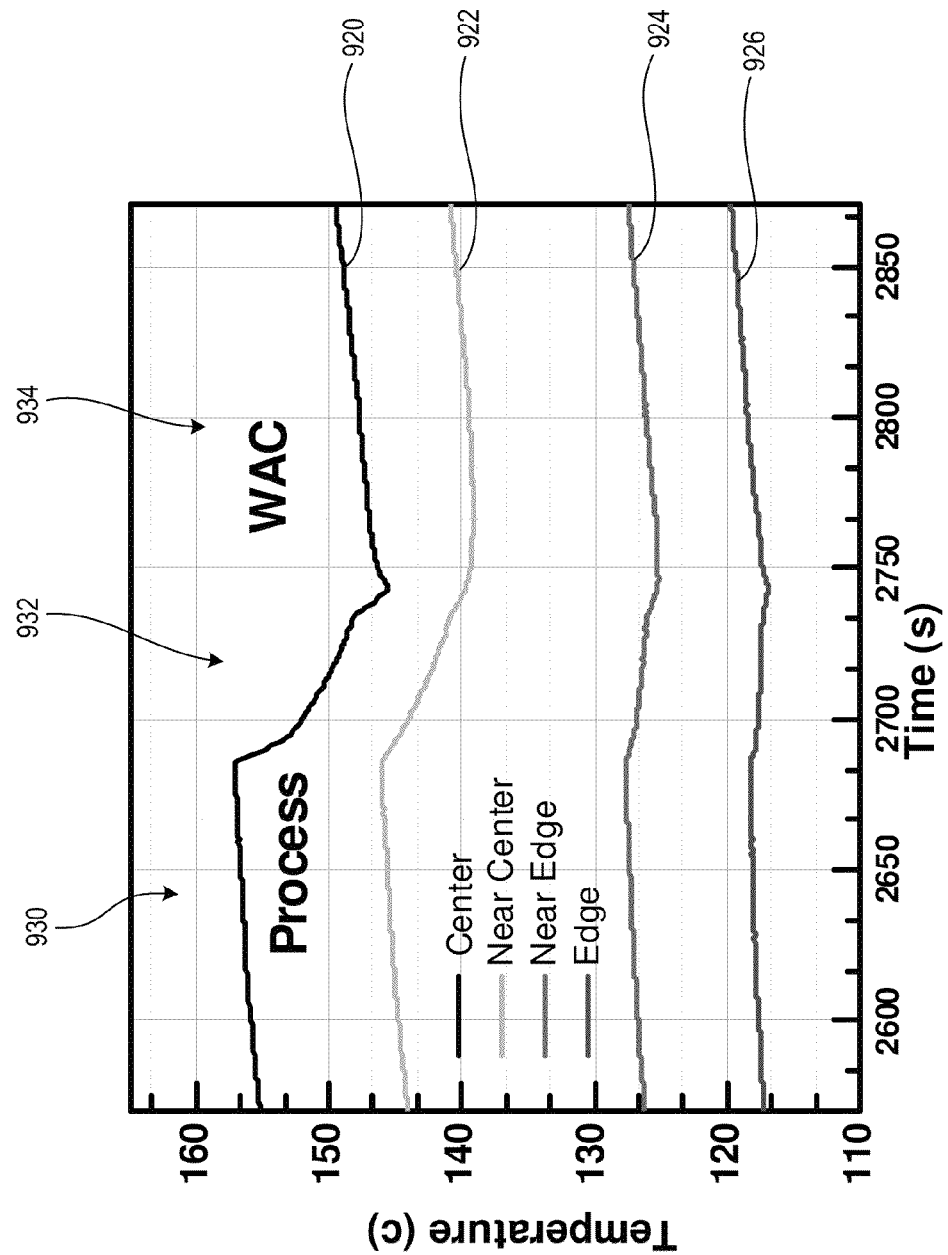

FIGS. 9A and 9B illustrate the temperature drop occurring between a process operation and a WAC operation, demonstrating the effect of a plasma heating operation in reducing thermal cycling, in accordance with an embodiment of the invention. FIG. 9A is a graph of temperature versus time for the faraday shield, showing a process operation and a subsequent WAC operation. The curves 900, 902, 904, and 906 illustrate the temperatures of the faraday shield measured at the center, near center, near edge, and edge locations, respectively. The recipe for the process operation is as follows: 2 mT, 1000 W TCP, TCCT=0.5, 1200 Wb, 100 sccm $NH_3$, equal, for 600 seconds. The recipe for the WAC operation is as follows: 15 mT, 1800 W TCP, 200 sccm $O_2$, for 600 seconds; and, 10 mT, 1800 W, 500 sccm $H_2$, for 100 seconds. Between the end of the process operation (reference 910) and the beginning of the WAC operation (reference 912), the temperature of the faraday shield drops significantly.

FIG. 9B is a graph of temperature versus time for the faraday shield during a plasma heating operation. The recipes for the process operation and the WAC operation are the same as described with reference to FIG. 9A. However, a plasma heating operation is inserted following the process operation. The recipe for the plasma heating operation is as follows: 10 mT, 1000 W, 300 sccm Ar, for 40 seconds. The 40-second plasma heating operation is carried out so as to occur during the following time periods: 7 seconds dechucking, 24 seconds transfer time, and 9 seconds stabilization time for WAC. In the illustrated graph, the process operation is shown at reference 930, the plasma heating operation is shown at reference 932, and the WAC operation is shown at reference 934. As can be seen, the application of the plasma heating operation during the dechucking, transfer, and stabilization time periods significantly reduces the magnitude of the temperature drop associated with transitioning from the process operation to the WAC operation.

Figure 10:
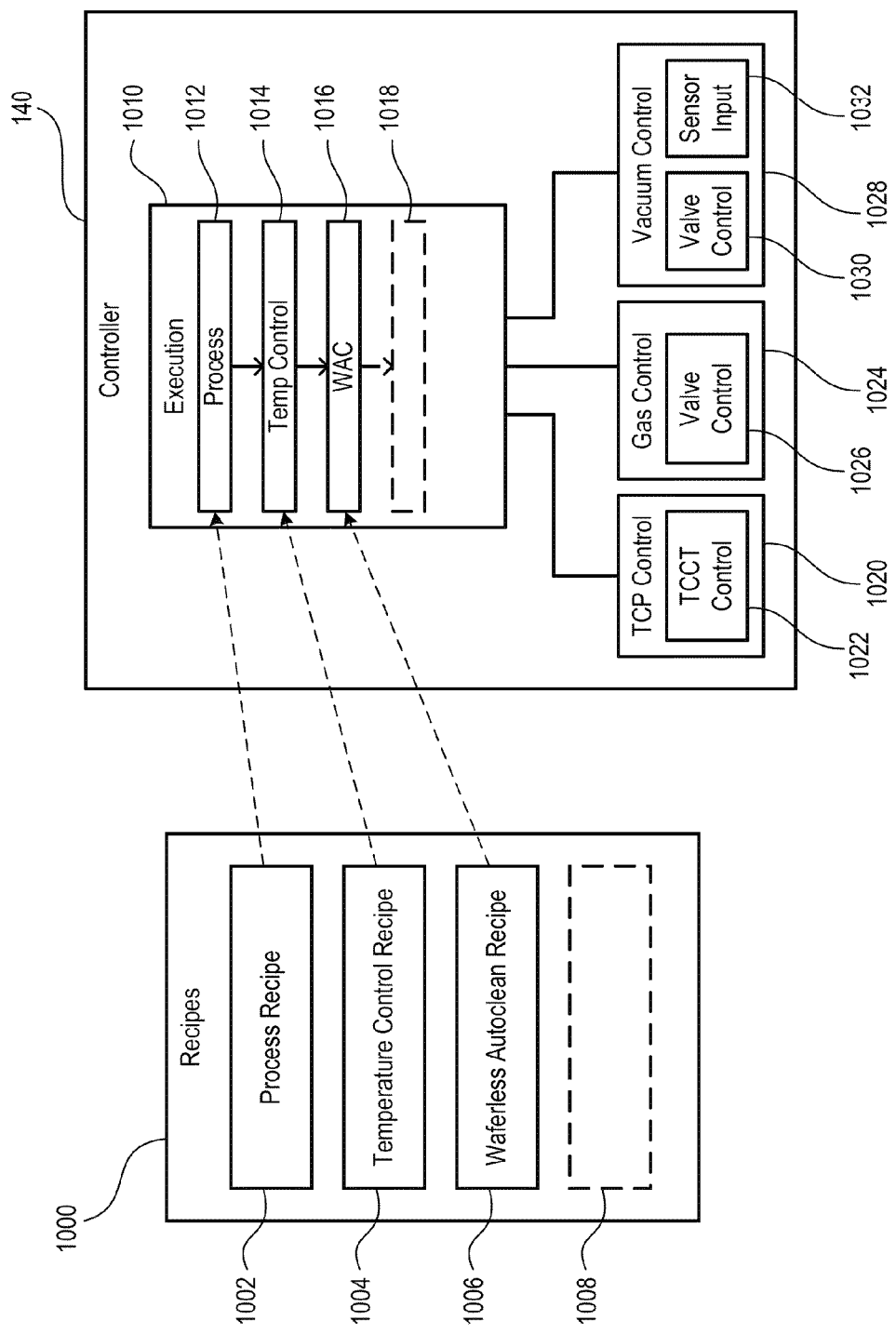
FIG. 10 illustrates a controller configured to execute a series of operations so as to limit thermal cycling of the faraday shield, in accordance with an embodiment of the invention.

FIG. 10 illustrates a controller configured to execute a series of operations so as to limit thermal cycling of the faraday shield, in accordance with an embodiment of the invention. The controller 140 includes an execution module 1010 that is configured to execute instructions that have been loaded in accordance with various recipes. A given recipe defines the parameters for an operation that is carried out in the process chamber. In the illustrated embodiment, a number of recipes 1000 are shown, including a process recipe 1002, a temperature control recipe 1004, a wafer was auto clean recipe 1006, and any other recipe 1008 that may be performed in the process chamber.

In the illustrated embodiment, the execution module 1010 is shown to have instructions loaded to perform a process operation 1012 that is defined by the process recipe 1002, followed by a temperature control operation 1014 that is defined by the temperature control recipe 1004, followed by a waferless auto clean operation 1016 that is defined by the way for the auto clean recipe 1006, followed by other operations 1018. In one embodiment, the temperature control recipe 1004 may define a no plasma heating operation, whereas in another embodiment the temperature control recipe 1004 define a plasma heating operation, in accordance with such operations as have been described herein. Broadly speaking, the temperature control operation carried out in accordance with the temperature control recipe is defined to limit the amount of thermal cycling of the faraday shield that would otherwise occur in the absence of such an operation. As has been demonstrated, this can be accomplished by applying power to the TCP coils in between other operations such as the aforementioned process operation and waferless auto clean operation.

In order to carry out a given operation, the execution module 1010 communicates with various control modules which are configured to control the operation of various aspects of the process chamber. For example, a TCP control module 1020 is provided for controlling the application of power to the TCP coils. The TCP control module can include TCCT control module 1022 which controls the TCCT parameter to facilitate tuning of the power application between the inner and outer coils. A gas control module 1024 controls the flow of gas into the process chamber, and may specifically include a valve control module 1026 which controls a valve through which gas flows from a gas source into the process chamber. A vacuum control module 1028 is provided for controlling the amount of vacuum applied to the process chamber, and may thereby control the overall pressure present in the process chamber. A valve control module 1030 may specifically control the operation of a valve that is disposed between a vacuum source in the process chamber. Additionally, a sensor input module 1032 can receive input from a pressure sensor in the process chamber to provide feedback to the vacuum control module 1028, which may adjust the amount of vacuum applied to the process chamber so as to achieve or maintain a predefined pressure in the process chamber.

Though embodiments have been described with reference to heating of the faraday shield between successive operations such as processing operations and waferless auto-clean operations, it should be appreciated that the techniques described herein can be applied to effect heating of the faraday shield when the process chamber is idle. That is, TCP power can be applied under no-plasma, limited plasma, or plasma generating conditions to heat the chamber and the faraday shield and maintain its temperature within a prescribed range when the plasma process chamber is idle. By heating the faraday shield to maintain its temperature within a prescribed range, thermal cycling is reduced, which reduces particle generation, as has been discussed.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for controlling thermal cycling of a faraday shield disposed in a plasma process chamber, comprising:
   performing a first plasma processing operation on a first wafer in the plasma process chamber;
   terminating the first plasma processing operation;
   performing a first wafer transfer operation to transfer the first wafer out of the chamber; and
   during the first wafer transfer operation, applying power to a TCP coil under a plasma limiting condition, the TCP coil disposed over the faraday shield.

2. The method of claim 1, wherein applying power to the TCP coil during the first wafer transfer operation prevents a drop in temperature greater than about 10 degrees Centigrade of a faraday shield of the plasma process chamber, the drop in temperature defined from a peak temperature of the faraday shield achieved during the first plasma processing operation.

3. The method of claim 1, further comprising,
   performing a second wafer transfer operation to transfer a second wafer into the plasma process chamber;
   during the second wafer transfer operation, applying power to the TCP coil under a plasma limiting condition; and
   performing a second plasma processing operation on the second wafer in the plasma process chamber.

4. The method of claim 1, further comprising, after the first wafer transfer operation, performing a wafer-less autocleaning operation.

5. The method of claim 4, wherein the applying power to the TCP coil during the first wafer transfer operation is continued during an initial stabilization period of the wafer-less autocleaning operation.

6. The method of claim 5, wherein after the initial stabilization period, the wafer-less autocleaning operation includes applying power to the TCP coil at a wattage higher than the applied power during the first wafer transfer operation.

7. The method of claim 1, wherein the plasma limiting condition is defined by a pressure of less than about 5 millitorr of nitrogen gas.

8. The method of claim 1, wherein applying power to the TCP coil during the first wafer transfer operation is at about 500 to about 1000 Watts.

9. A method for controlling thermal cycling of a faraday shield disposed in a plasma process chamber, comprising:
   performing a first plasma processing operation on a first wafer in the plasma process chamber;
   terminating the first plasma processing operation;
   performing a first wafer transfer operation to transfer the first wafer out of the chamber;
   during the first wafer transfer operation, applying power to a TCP coil under a plasma limiting condition, the TCP coil disposed over the faraday shield;
   performing a second wafer transfer operation to transfer a second wafer into the plasma process chamber;
   during the second wafer transfer operation, applying power to the TCP coil under a plasma limiting condition; and
   performing a second plasma processing operation on the second wafer in the plasma process chamber.

10. The method of claim 9, wherein applying power to the TCP coil during the first and second wafer transfer operations prevents a drop in temperature greater than about 10 degrees Centigrade of a faraday shield of the plasma process chamber, the drop in temperature defined from a peak temperature of the faraday shield achieved during the first plasma processing operation.

11. The method of claim 9, further comprising, after the first wafer transfer operation, and prior to the second wafer transfer operation, performing a wafer-less autocleaning operation.

12. The method of claim 11, wherein the applying power to the TCP coil during the first wafer transfer operation is continued during an initial stabilization period of the wafer-less autocleaning operation.

13. The method of claim 12, wherein after the initial stabilization period, the wafer-less autocleaning operation includes applying power to the TCP coil at a wattage higher than the applied power during the first wafer transfer operation.

14. The method of claim 9,
   wherein the plasma limiting condition is defined by a pressure of less than about 5 millitorr of nitrogen gas; and
   wherein applying power to the TCP coil during the first wafer transfer operation is at about 500 to about 1000 Watts.

15. A method for controlling thermal cycling of a faraday shield disposed in a plasma process chamber, comprising:
   performing a first plasma processing operation on a first wafer in the plasma process chamber;
   terminating the first plasma processing operation;
   performing a first wafer transfer operation to transfer the first wafer out of the chamber;
   during the first wafer transfer operation, applying power to a TCP coil at about 500 to about 1000 Watts under a plasma limiting condition, the TCP coil disposed over the faraday shield;
   performing a wafer-less autocleaning operation.

16. The method of claim 15, wherein applying power to the TCP coil during the first wafer transfer operation prevents a drop in temperature greater than about 10 degrees Centigrade of a faraday shield of the plasma process chamber, the drop in temperature defined from a peak temperature of the faraday shield achieved during the first plasma processing operation.

17. The method of claim 15, wherein the applying power to the TCP coil during the first wafer transfer operation is continued during an initial stabilization period of the wafer-less autocleaning operation.

18. The method of claim 17, wherein after the initial stabilization period, the wafer-less autocleaning operation includes applying power to the TCP coil at a wattage higher than the applied power during the first wafer transfer operation.

19. The method of claim 15, further comprising,
performing a second wafer transfer operation to transfer a second wafer into the plasma process chamber;
during the second wafer transfer operation, applying power to the TCP coil under a plasma limiting condition; and
performing a second plasma processing operation on the second wafer in the plasma process chamber.

20. The method of claim 15, wherein the plasma limiting condition is defined by a pressure of less than about 5 millitorr of nitrogen gas.

\* \* \* \* \*